(12) United States Patent
Jung et al.

(10) Patent No.: US 8,018,278 B2
(45) Date of Patent: Sep. 13, 2011

(54) PRE-DISTORTION APPARATUS OF POWER AMPLIFIER AND METHOD THEREOF

(75) Inventors: Jae-Ho Jung, Daejeon (KR); Gweon-Do Jo, Daejeon (KR); Young-Hoon Kim, Daejeon (KR); Jung-Hoon Oh, Daejeon (KR); Kwang-Chun Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/883,580

(22) Filed: Sep. 16, 2010

(65) Prior Publication Data

US 2011/0063026 A1    Mar. 17, 2011

(30) Foreign Application Priority Data

Sep. 17, 2009 (KR) .................. 10-2009-0088208
Jun. 30, 2010 (KR) .................. 10-2010-0062781

(51) Int. Cl.
*H03F 1/26* (2006.01)
(52) U.S. Cl. ....................... 330/149; 375/297
(58) Field of Classification Search .................. 330/149, 330/129, 136; 375/297
See application file for complete search history.

(56) References Cited

U.S. PATENT DOCUMENTS

| 6,798,843 | B1 * | 9/2004 | Wright et al. ............... 375/296 |
| 6,853,246 | B2 * | 2/2005 | Bauder et al. .............. 330/149 |
| 2004/0198263 | A1 | 10/2004 | Ode et al. |
| 2008/0068191 | A1 * | 3/2008 | Maeda et al. ............... 340/635 |
| 2010/0327971 | A1 * | 12/2010 | Kumagai .................... 330/149 |

FOREIGN PATENT DOCUMENTS

| JP | 2002-223171 | 8/2002 |
| KR | 10-2007-0007125 | 1/2007 |
| KR | 10-2009-0082854 | 7/2009 |

* cited by examiner

*Primary Examiner* — Henry K Choe
(74) *Attorney, Agent, or Firm* — Staas & Halsey LLP

(57) ABSTRACT

A pre-distortion apparatus of a power amplifier includes: a pre-distortion unit configured to generate a pre-distorted signal of an input signal by calculating a magnitude of the input signal and outputting a complex correction coefficient corresponding to the calculated magnitude of the input signal, and provide the generated pre-distorted signal as an input of the power amplifier; and a complex correct coefficient update unit configured to generate an error signal by comparing an output signal of the power amplifier with the input signal and updating the complex correction coefficient to minimize a magnitude of the generated error signal, wherein the pre-distortion unit provides a constant bias value corresponding to the magnitude of the input signal as a bias of the power amplifier while updating the complex correction coefficient.

8 Claims, 4 Drawing Sheets

PRE-DISTORTION APPARATUS OF POWER AMPLIFIER AND METHOD THEREOF

CROSS-REFERENCES TO RELATED APPLICATIONS

The present application claims priority of Korean Patent Application Nos. 10-2009-0088208 and 10-2010-0062781, filed on Sep. 17, 2009, and Jun. 30, 2010, respectively, which are incorporated herein by reference in their entirety.

BACKGROUND OF THE INVENTION

1. Field of the Invention

Exemplary embodiments of the present invention relate to a pre-distortion apparatus and a method thereof; and, more particularly, to a pre-distortion apparatus for minimizing distortion of an output signal output from a power amplifier and a method thereof.

2. Description of Related Art

In wired/wireless communication system, a transmitter amplifies a power of a transmission signal to be reached at a receiver because the transmission signal is attenuated in a wired/wireless channel. The transmitter commonly employs a power amplifier for amplifying the power of the transmission signal.

The power amplifier must maintain linearity of an input signal and an output signal to improve efficiency. However, the power amplifier has a non-linearity property.

Many methods have been introduced to linearize the non-linearity property of the power amplifier. Among them, a digital pre-distortion method was introduced to improve the non-linearity property of the power amplifier. The digital pre-distortion method distorts an input signal in advance to linearize a relation between an input signal and an output signal of a power amplifier.

Particularly, the digital pre-distortion method includes a complex gain type digital pre-distortion method and a polynomial type digital pre-distortion method. The complex gain type digital pre-distortion method calculates a complex correction value according to a magnitude of an input signal by adaptively comparing the input signal with a non-linear distorted signal and corrects the input signal in real time based on the complex correction value. The polynomial type digital pre-distortion method approximates a non-linear property of a power amplifier to a polynomial expression, adaptively calculates a coefficient of the polynomial expression from input and output signals, calculates an inverse transfer function of the power amplifier, and corrects a transmission signal based on the inverse transfer function.

A complex gain type digital pre-distortion apparatus provides a linearization method when a property of a power amplifier is not changed due to a constant bias voltage. Lately, a high power amplifier is commonly used. The high power amplifier has a bias voltage dynamically changing according to an input signal. Accordingly, the property of the high power amplifier is changed according to a magnitude of an input signal. Therefore, it is difficult to linearize the high power amplifier using the digital pre-distortion apparatus.

When a communication system employs a pre-distortion apparatus with a high power amplifier having a bias varying according to an input signal, a bias voltage of the high power amplifier is changed while updating a complex correction coefficient. Therefore, a convergence property of an adaptive algorithm is deteriorated.

SUMMARY OF THE INVENTION

An embodiment of the present invention is directed to a pre-distortion apparatus for minimizing distortion of an output signal by linearizing a power amplifier, and a method thereof.

Another embodiment of the present invention is directed to a pre-distortion apparatus for fixing a bias voltage of a power amplifier while updating a complex correction coefficient, and a method thereof.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, a pre-distortion apparatus of a power amplifier includes: a pre-distortion unit configured to generate a pre-distorted signal of an input signal by calculating a magnitude of the input signal and outputting a complex correction coefficient corresponding to the calculated magnitude of the input signal, and provide the generated pre-distorted signal as an input of the power amplifier; and a complex correct coefficient update unit configured to generate an error signal by comparing an output signal of the power amplifier with the input signal and updating the complex correction coefficient to minimize a magnitude of the generated error signal, wherein the pre-distortion unit provides a constant bias value corresponding to the magnitude of the input signal as a bias of the power amplifier while updating the complex correction coefficient.

In accordance with an embodiment of the present invention, a pre-distortion method of a power amplifier includes: calculating a magnitude of an input signal; outputting a complex correction coefficient and a bias value of the power amplifier corresponding to the calculated magnitude of the input signal; providing the bias value as the a bias of the power amplifier while updating the complex correction coefficient; generating a pre-distorted signal by multiplying the complex correction coefficient with the input signal; generating an error signal by comparing the output signal and the input signal of the power amplifier; and updating the complex correction coefficient to minimize a magnitude of the generated error signal.

DESCRIPTION OF SPECIFIC EMBODIMENTS

Figure 1:
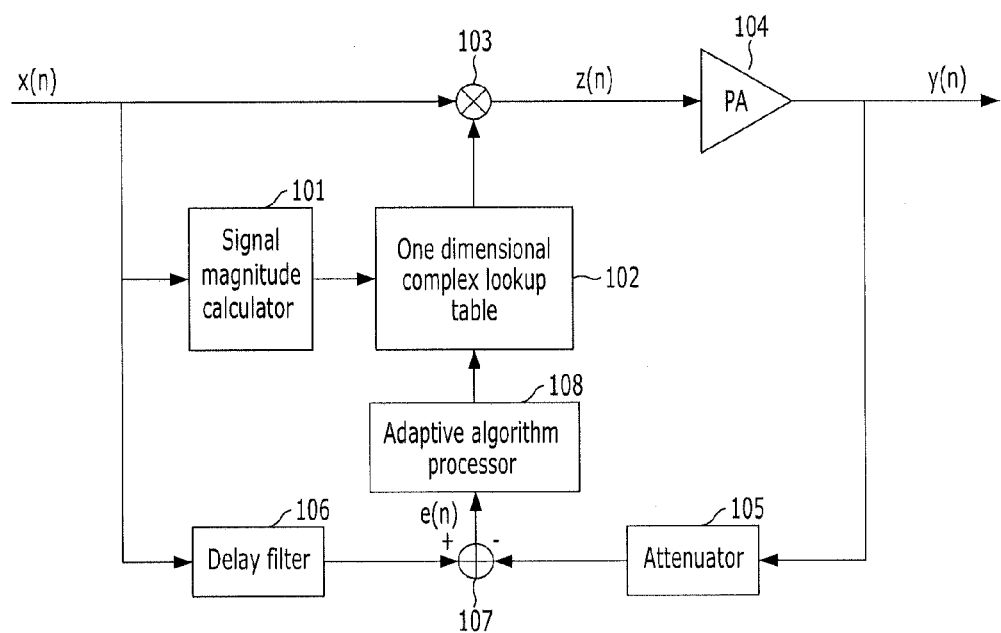
FIG. 1 is a block diagram illustrating a complex gain type digital pre-distortion apparatus.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. The drawings are not necessarily to scale and in some instances, proportions may have been exaggerated in order to clearly illustrate features of the embodiments.

Embodiments of the present invention relate to a pre-distortion apparatus for linearizing a high power amplifier having a non-linearity property decided according to a magnitude of an input signal and a method thereof. The pre-distortion apparatus in accordance with an embodiment of the present invention minimizes distortion of an output signal output from a high power amplifier by adaptively calculating a complex correction value according to a magnitude of an input signal and effectively compensating an input signal using the calculated complex correction value.

Hereinafter, the pre-distortion apparatus and method in accordance with an embodiment of the present invention will be described with reference to the accompanying drawings.

FIG. 1 is a block diagram illustrating a complex gain type digital pre-distortion apparatus.

Referring to FIG. 1, the complex gain type digital pre-distortion apparatus includes a signal magnitude calculator 101, a one-dimensional complex lookup table 102, a multiplier 103, a power amplifier 104, an attenuator 105, a delay filter 106, an adder 107, and an adaptive algorithm processor 108.

The signal magnitude calculator 101 calculates a magnitude of a transmission signal x(n).

The one-dimensional complex lookup table 102 receives the calculated magnitude of the transmission signal from the signal magnitude calculator 101. The one-dimensional complex lookup table 102 previously stores complex correction coefficients according to magnitudes of input signals. The one-dimensional lookup table 102 outputs a complex correction coefficient corresponding to the calculated magnitude of the transmission signal.

The multiplier 103 multiplies the complex correction coefficient outputted from the one-dimensional complex lookup table 102 with the transmission signal x(n) and outputs a pre-distortion signal z(n).

A digital-analog converter (not shown) and a frequency up-convertor (not shown) convert the pre-distortion signal z(n) output from the multiplexer 103 to a Radio Frequency (RF) signal. The RF signal is input to the non-linear power amplifier 104.

An output signal of the power amplifier 104 is fed back to the attenuator 105.

The attenuator 105 reduces the magnitude of the feedback signal as much as a gain of the power amplifier 104.

The attenuated signal of the attenuator 105 is converted to a digital signal and is input to the comparator 107.

The delay filter 106 generates a delayed signal by filtering the original transmission signal x(n). The comparator 107 receives the delayed signal from the delay filter 106 and compares the delayed signal with a digital output signal. The comparator 107 generates an error signal e(n) based on the comparison result.

The adaptive algorithm processor 108 updates the complex correction coefficients stored in the one-dimensional lookup table 102 using a least square method in order to minimize the magnitude of the error signal e(n) output from the comparator 107.

As shown in FIG. 1, the complex gain type digital pre-distortion apparatus introduces a linearization method when the property of the power amplifier 104 is not changed by a constant bias voltage. However, a high power amplifier has been commonly used lately. The high power amplifier has a bias voltage changed according to an input signal. Therefore, the property of the high power amplifier is changed according to the magnitude of an input signal. As a result, it is difficult to linearize the high power amplifier using the typical digital pre-distortion apparatus shown in FIG. 1.

Further, when the pre-distortion apparatus of FIG. 1 is employed with a high power amplifier having a bias varying according to an input signal, a bias voltage of a high power amplifier is changed while updating a complex correction coefficient. Therefore, a convergence property of an adaptive algorithm becomes deteriorated.

In order to overcome the programs of the typical pre-distortion apparatus, an embodiment of the present invention relates to a pre-distortion apparatus for minimizing distortion of an output signal output from a power amplifier and a method thereof.

Figure 2:
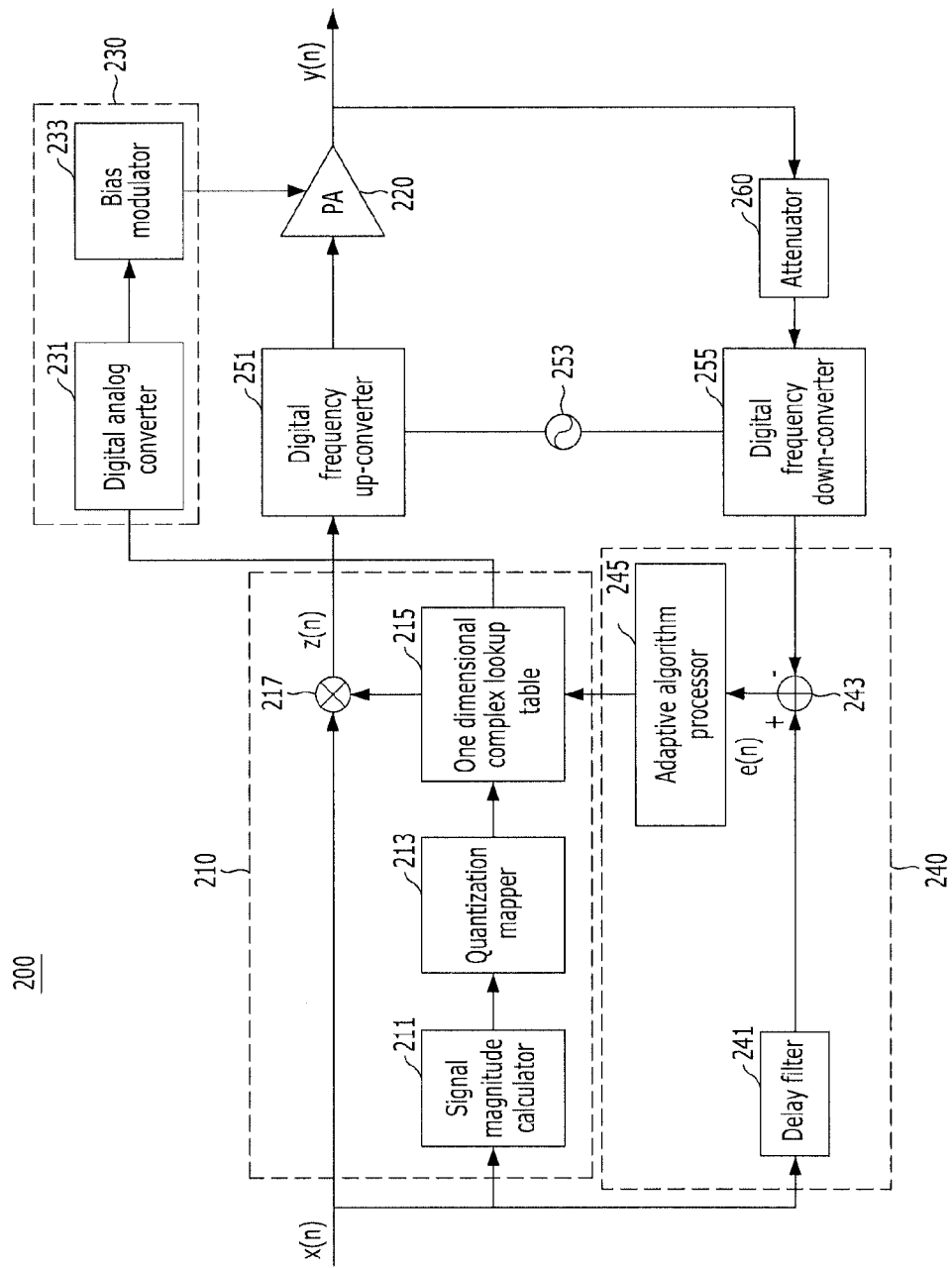
FIG. 2 is a block diagram illustrating a pre-distortion apparatus in accordance with an embodiment of the present invention.

FIG. 2 is a block diagram illustrating a pre-distortion apparatus in accordance with an embodiment of the present invention.

Referring to FIG. 2, the pre-distortion apparatus in accordance with an embodiment of the present invention includes a pre-distortion unit 210, and a complex correction coefficient update unit 240.

The pre-distortion unit 210 generates a pre-distorted signal z(n) of an input signal x(n) by calculating a magnitude of the input signal x(n) and outputting a complex correction coefficient corresponding to the calculated magnitude of the input signal x(n). Then, the pre-distortion unit 210 provides the generated pre-distorted signal z(n) to an input terminal of a power amplifier (PA) 220.

The pre-distortion unit 210 provides a constant bias voltage value corresponding to the magnitude of the input signal x(n) to a bias terminal of the power amplifier 200 while updating the outputted complex correct coefficient.

The pre-distortion unit 210 will be described in detail with reference to FIG. 2.

Referring to FIG. 2, the pre-distortion unit 210 includes an input signal magnitude calculator 211, a quantization mapper 213, a one-dimensional lookup table 215, and a multiplier 217.

The input signal magnitude calculator 211 receives the input signal x(n) and calculates the magnitude of the input signal x(n).

The quantization mapper 213 quantizes the calculated magnitude of the input signal x(n) from the input signal magnitude calculator 211. The quantization mapper 213 maps the quantized data to one of memory addresses. The quantization mapper 213 outputs the mapped memory address to the one-dimensional lookup table 215.

The one-dimensional lookup table 215 outputs a complex correction coefficient and a bias voltage value, which are indicated by the input memory address. Hereinafter, the one-dimensional lookup table 215 will be described with reference to FIG. 3.

Figure 3:
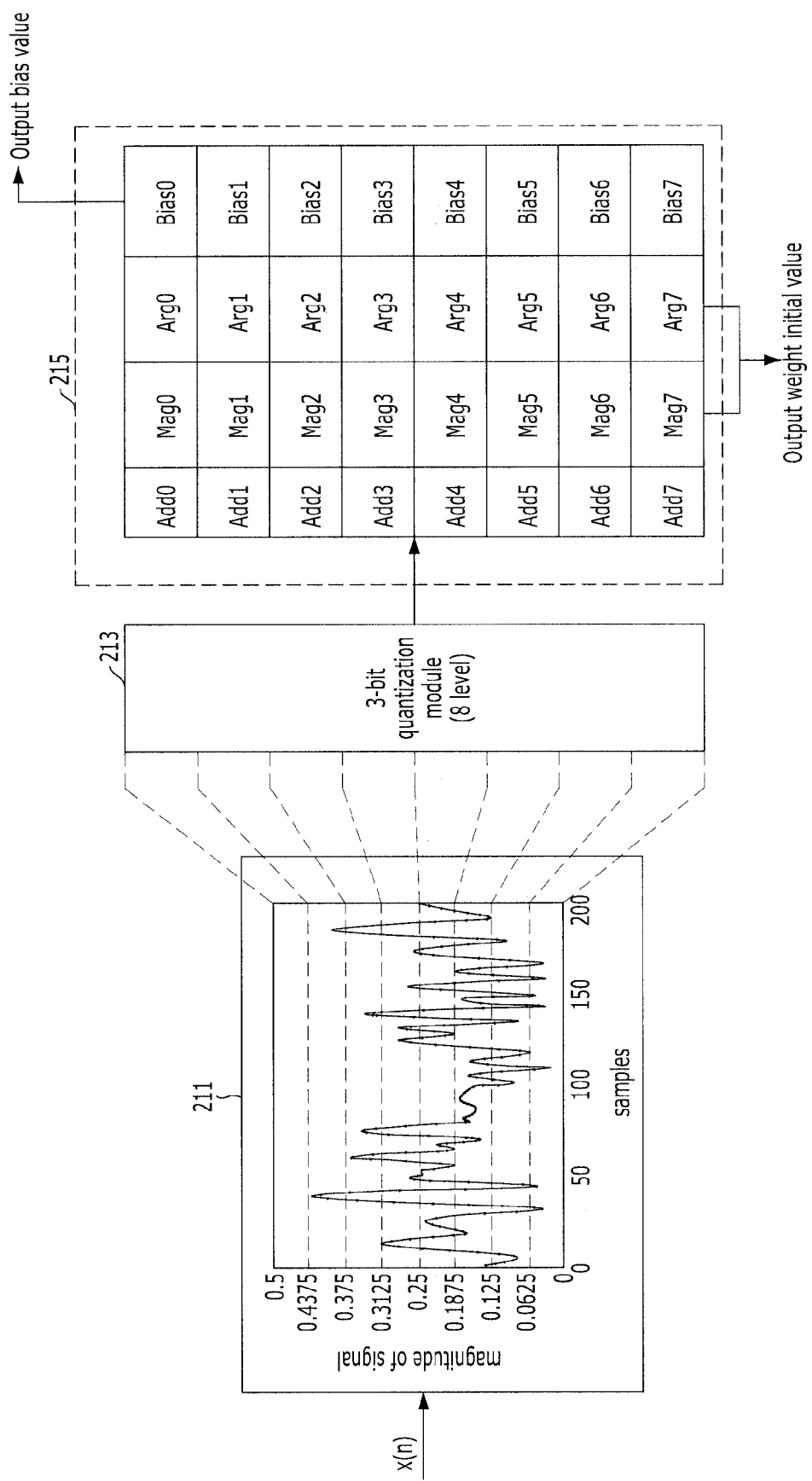
FIG. 3 is a diagram illustrating an one-dimensional complex lookup table of a pre-distortion apparatus shown in FIG. 2.

FIG. 3 is a block diagram illustrating the one-dimensional lookup table in the pre-distortion apparatus in accordance with an embodiment of the present invention.

Referring to FIG. 3, the signal magnitude calculator 211 receives an input signal x(n), divides a time (x-axis) by a plurality of predetermined samples and calculates the magnitude of the input signal x(n) of each sample.

The quantization mapper 213 receives the calculated magnitude data from the input signal magnitude calculator 211, quantizes the magnitude data, and maps the quantized data to predetermined memory addresses. For example, the input signal magnitude is divided into eight levels (3-bits) and each level is mapped to a different memory address. If the magnitude of the input signal is in 0.25-0.31252, the input signal is mapped to a memory address Add3 which is allocated to a level of 0.2~50.31252. The quantization mapper 213 outputs the memory address Add3 to the one-dimensional lookup table 215.

The one-dimensional look table 215 receives the predetermined memory address Add3 and outputs complex correction coefficients Mag3 and Ang3 and a bias value bias 3, which are indicated by the received memory address Add3. The output complex correction coefficients Mag3 and Ang3 are input to the multiplier 217 shown in FIG. 2, and the bias value bias 3 is input to the bias provider 230 and used as a bias voltage of the power amplifier 220. Although a magnitude of an input signal x(n) mapped to the memory address Add3 is different, the one-dimensional lookup table 215 always outputs a Bias value corresponding to the address Add3 to be used as a bias value of the power amplifier. Therefore, the bias of the power amplifier 220 can be fixed while the complex correction coefficients Mag3 and Ang3 are updated.

The multiplier 217 multiplies the complex correction coefficient output from the one-dimensional lookup table 215 with the input signal x(n) and outputs the multiplying result as the pre-distorted signal s(n).

The complex correction coefficient update unit 240 generates an error signal e(n) by comparing the output signal y(n) of the power amplifier 220 with the input signal x(n) and updates the complex correction coefficient output from the one-dimensional lookup table 215 in order to minimize the magnitude of the generated error signal e(n).

Particularly, the complex correction coefficient update unit 240 includes a delay filter 241, a comparator 243, and an adaptive algorithm processor 245.

The delay filter 241 delays the input signal x(n) as long as a predetermined time for synchronizing an initial input signal x(n) with an output signal of the power amplifier 220 after passing through the pre-distortion unit 210.

The attenuator 250 receives the output signal y(n) from the power amplifier 220 and attenuates the outputs signal. The comparator 243 receives an attenuated signal from the attenuator 250 and generates the error signal e(n) by subtracting the attenuated output signal from the delayed input signal from the delay filter 241.

The adaptive algorithm processor 245 receives the generated error signal e(n) from the comparator 243 and updates the complex correction coefficients stored in the one-dimensional lookup table 215 using an adaptive algorithm such as the least square method in order to minimize the error signal e(n).

The bias provider 230 receives the bias voltage value from the one-dimensional lookup table 215, converts the bias voltage value to an analog signal, modulates the analog signal, and outputs the modulated signal to the bias terminal of the power amplifier 220.

The bias provider 230 may include a digital analog converter 231 and a bias modulator 233. The digital analog converter 231 converts the digital bias value from the one-dimensional lookup table 215 to an analog bias value signal. The bias modulator 233 modulates the analog bias value signal o from the digital analog converter 231 and outputs the modulated signal to the bias terminal of the power amplifier 220.

In FIG. 2, the digital frequency up-converter 251 converts the pre-distorted signal z(n) to an analog pre-distorted signal, up-converts the analog pre-distorted signal with reference to a local oscillation frequency of the local oscillator 253 to a RF signal, and outputs the RF signal. The RF signal output from the digital frequency up-converter 251 is input to an input terminal of the power amplifier 220.

The attenuator 260 attenuates the output signal y(n) from the power amplifier 220 as much as a gain of the power amplifier 220.

The digital frequency down-converter 255 converts the attenuated signal from the attenuator 260 to a digital signal and down-converts the digital signal with reference to a local oscillator frequency of the local oscillator 253. The digital frequency down-converter 255 outputs the down-converted signal to the comparator 243 of the complex correction coefficient update unit 240.

Hereinafter, a pre-distortion method in accordance with an embodiment of the present invention will be described with reference to FIG. 4.

Figure 4:
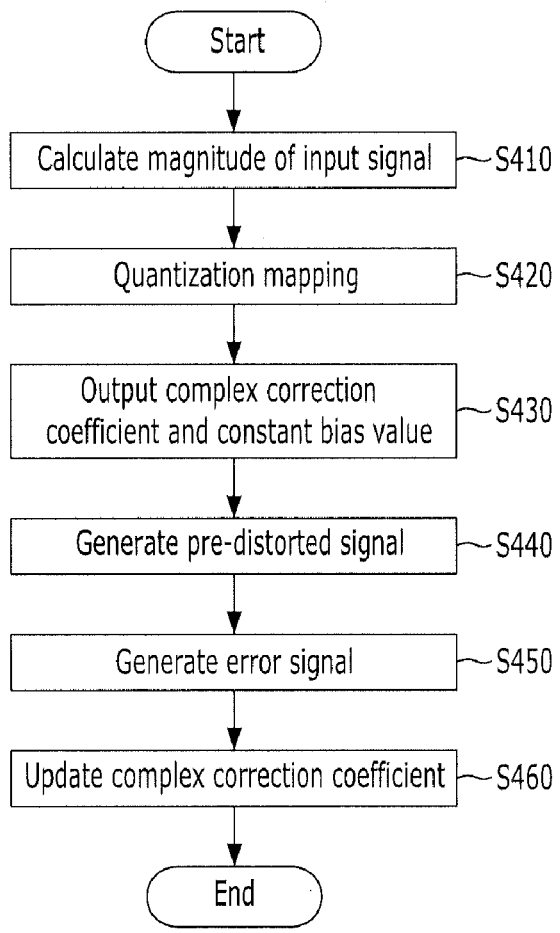
FIG. 4 is a flowchart showing a pre-distortion method in accordance with an embodiment of the present invention.

Referring to FIG. 4, at step S410, a magnitude of a transmission signal such as an input signal x(n) is calculated. Particularly, a time is sampled as predetermined samples and calculates a representative value of each sample.

At step S420, magnitude data of the input signal for each sample is quantized and mapped. The magnitude data of the input signal is mapped to a predetermined memory address. For instance, an input signal magnitude is divided into eight levels (3-bits) and different memory addresses are allocated to each level. If the input signal magnitude is in between 0.25 to 0.31242, the input signal is mapped to a memory address Add3 which is allocated to a 0.25-0.31252 level.

At step S430, a complex correction coefficient indicated by the predetermined memory address is output with reference to the one-dimensional lookup table. Further, a constant bias value is output too. As shown in FIG. 3, the one-dimensional lookup table stores different complex correction coefficients and bias values for each memory address. Therefore, the one-dimensional lookup table can output a complex correction coefficient and a bias value, which are indicated by the input memory address. For example, when the one-dimensional lookup table receives a memory address Add3, the one-dimensional lookup table outputs the complex correction coefficients Magi and Ang3 and a bias value (bias 3) which are indicated by the input address Add3.

At step S440, a pre-distorted signal is generated by multiplying the output complex correction coefficients with the input signal.

The output bias value is converted to an analog signal, modulated through a bias modulator, and used as a bias of a power amplifier.

The generated pre-distorted signal is converted to an analog signal and up-converted to a RF signal. The RF signal is input to an input terminal of the power amplifier.

The power amplifier amplifies the RF signal input using the bias value outputted at the previous step S420.

At step S450, an error signal of the input signal is generated by feeding back the output signal of the power amplifier and comparing the feedback signal with an initial input signal. Particularly, the error signal is generated by subtracting the down-converted output signal from the delayed input signal. The down-converted output signal is a signal down-converted after being attenuated as much as a gain of a power amplifier.

At step S460, the output complex correction coefficients are updated using an adaptive algorithm such as the least square method to minimize the generated error signal.

As shown in FIGS. 2 to 4, the pre-distortion apparatus and method in accordance with an embodiment of the present invention can prevent an output signal of a power amplifier from being distorted by fixing a bias while updating a complex correction coefficient in order that a property of a power amplifier is not to be changed although a magnitude of an input signal is changed. Further, the pre-distortion apparatus and method in accordance with an embodiment of the present invention prevents a convergence property of an adaptive algorithm from being deteriorated.

Also, using the pre-distortion apparatus and method in accordance with an embodiment of the present invention, a typical complex gain type pre-distortion apparatus may be simply and effectively combined with a high power amplifier having a variable bias.

While the present invention has been described with respect to the specific embodiments, it will be apparent to those skilled in the art that various changes and modifications may be made without departing from the spirit and scope of the invention as defined in the following claims.

What is claimed is:

1. A pre-distortion apparatus of a power amplifier, comprising:
    pre-distortion unit configured to generate a pre-distorted signal of a varying input signal by calculating a magnitude of the input signal and outputting a complex correction coefficient corresponding to the calculated magnitude of the input signal, and provide the generated pre-distorted signal as an input of the power amplifier; and
    a complex correct coefficient update unit configured to generate an error signal by comparing an output signal of the power amplifier with the input signal and updating the complex correction coefficient to minimize a magnitude of the generated error signal,
    wherein the pre-distortion unit provides a constant bias value corresponding to the magnitude of the input signal as a bias of the power amplifier while updating the complex correction coefficient.

2. The pre-distortion apparatus of claim 1, wherein the pre-distortion unit includes:
    an input signal magnitude calculator configured to calculate a magnitude of the input signal;
    a quantization mapper configured to quantize a magnitude of the calculated input signal, map the quantized data to one of stored memory addresses, and output the mapped memory address;
    a lookup table configured to receive the output memory address and output a complex correction coefficient and the bias voltage value, which are indicated by the memory address; and
    a multiplier configured to output the pre-distorted signal by multiplying the output complex correct coefficient with the input signal.

3. The pre-distortion apparatus of claim 1, wherein the complex correction coefficient update unit includes:
    a delay filter configured to delay the input signal as much as a predetermined time;
    a comparator configured to generate the error signal by subtracting an output signal of the power amplifier from the delayed input signal; and
    an adaptive algorithm processor configured to receive the generated error signal and update the complex correction coefficient using an adaptive algorithm that minimizes the error signal.

4. The pre-distortion apparatus of claim 3, wherein the adaptive algorithm is a least square algorithm.

5. A pre-distortion method of a power amplifier, comprising:
    calculating a magnitude of a varying input signal;
    outputting a complex correction coefficient and a constant bias value of the power amplifier corresponding to the calculated magnitude of the input signal;
    providing the bias value as the a bias of the power amplifier while updating the complex correction coefficient;
    generating a pre-distorted signal by multiplying the complex correction coefficient with the input signal; generating an error signal by comparing the output signal and the input signal of the power amplifier; and
    updating the complex correction coefficient to minimize a magnitude of the generated error signal.

6. The pre-distortion method of claim 5, wherein said outputting a complex correction coefficient includes:
    quantizing the calculated magnitude of the input signal;
    mapping the quantized data to one of stored memory addresses, and outputting the mapped memory address; and
    outputting the complex correction coefficient and the bias voltage value indicated by the output memory address.

7. The pre-distortion method of claim 5, wherein said generating a pre-distorted signal includes:
    delaying the input signal as much as a predetermined time; and
    generating the error signal by subtracting an output signal of the power amplifier from the delayed input signal.

8. The pre-distortion method of claim 5, wherein the adaptive algorithm is a least square method.

* * * * *